United States Patent [19]

Shinbara

[11] Patent Number: 4,533,882
[45] Date of Patent: Aug. 6, 1985

[54] FREQUENCY MODULATOR WHEREIN MODULATION TAKES PLACE IN A FEEDBACK LOOP OF AN OSCILLATOR

[75] Inventor: Seitaro Shinbara, Yokohama, Japan

[73] Assignee: Tokyo Shibaura Denki Kabushiki Kaisha, Kawasaki, Japan

[21] Appl. No.: 579,458

[22] Filed: Feb. 13, 1984

[30] Foreign Application Priority Data

Feb. 16, 1983 [JP] Japan ................................ 58-24323

[51] Int. Cl.³ .............................................. H03C 3/02
[52] U.S. Cl. ................................ 332/16 T; 332/23 R; 455/42; 455/110
[58] Field of Search .................. 332/16 T, 16 R, 23 R, 332/23 A, 24; 455/110, 112, 113, 42

[56] References Cited

U.S. PATENT DOCUMENTS 3,564,456 2/1971 Denny, Jr. ..................... 332/16 T
3,815,052 6/1974 Watatani et al. ............. 332/16 T X

OTHER PUBLICATIONS

Tateshita et al., "IC for RF Modulator in VCR", Toshiba Review, vol. 36, No. 9, pp. 838-842 (Aug., 1981).

Primary Examiner—Siegfried H. Grimm
Attorney, Agent, or Firm—Schwartz, Jeffery, Schwaab, Mack, Blumenthal & Evans

[57] ABSTRACT

A frequency modulator comprises an oscillator circuit, a phase shift circuit for phase-shifting an oscillation output of said oscillator circuit by 90 degrees, a multiplier circuit for multiplying an output of the phase shift circuit by a modulating signal, and a phase adder circuit for varying an oscillation frequency of the oscillator circuit by adding the output of the multiplier circuit. The amplification elements of the phase adder circuit and the oscillator circuit are connected in parallel with respect to a power source. The multiplier circuit comprises an amplification element connected to receive the output of the phase shift circuit. A constant current source circuit is connected in series with the amplification element of the multiplier circuit and serves to vary the magnitude of current passing therethrough in accordance with the modulating signal.

5 Claims, 3 Drawing Figures

FREQUENCY MODULATOR WHEREIN MODULATION TAKES PLACE IN A FEEDBACK LOOP OF AN OSCILLATOR

BACKGROUND OF THE INVENTION

The present invention relates to a frequency modulator.

A prior art frequency modulator has been constructed typically in a manner such as shown in FIG. 1. In the figure, a modulating signal v(t), such as an audio signal, is amplified by an amplifier circuit 1, the outputs from which are applied to the bases of transistors 21 to 24, each functioning as an amplification element of a multiplier circuit 2. Oscillation outputs from an oscillator circuit 4 are phase-shifted at a phase shift circuit 3 by an amount of 90 degrees, and the phase shifted oscillation outputs are supplied to the emitters of the transistors 21 to 24. The outputs of the multiplier circuit 2 are applied to a phase adder circuit 5, thereby varying the oscillation frequency of the oscillator circuit 4.

The frequency modulator constructed as above, however, has the following problems. That is, as seen from FIG. 1, since the outputs from the amplifier circuit 1 are applied to the bases of the transistors 21 to 24 of the multiplier circuit 2, the level of the signals to be supplied to the multiplier circuit 2 must be kept low. The adjustment of such low level signals, however, is difficult to achieve. In addition, since the outputs of the phase shift circuit 3 are applied to the emitters of the transistors 21 to 24 of the multiplier circuit 2, the magnitude of the input signal current to the transistors 21 to 24 is affected by the emitter resistance of the transistors 21 to 24. Difficulties are therefore encountered in designing the phase shift circuit 3, and the degree of frequency modulation is varied with manufacturing tolerances. Moreover, since the circuit is arranged such that the oscillation frequency is changed by causing the output current of the multiplier circuit 2 to flow through both oscillator circuit 4 and phase adder circuit 5, the amplification elements of the multiplier circuit 2, the oscillator circuit 4, and the phase adder circuit 5 are connected together in series with respect to a power source, resulting in a necessity for a relatively high power source voltage.

SUMMARY OF THE INVENTION

An object of the invention is to provide a frequency modulator in which signals to be supplied from a modulating signal amplifier to a multiplier circuit can be of a higher level; the design for a phase shifter is easier; and the voltage level of a power source to be provided for an oscillator circuit can be low.

In accordance with the present invention, a frequency modulator is provided in which the amplification elements of both phase adder circuit and oscillator circuit are connected in parallel with respect to a power source, and in which a multiplier circuit comprises an amplification element for receiving the outputs of a phase shift circuit, and a constant current source circuit connected in series with the amplification element and varying the current passing therethrough in accordance with a modulating signal.

DETAILED DESCRIPTION OF THE PREFERRED EMBODIMENT

Figure 1:
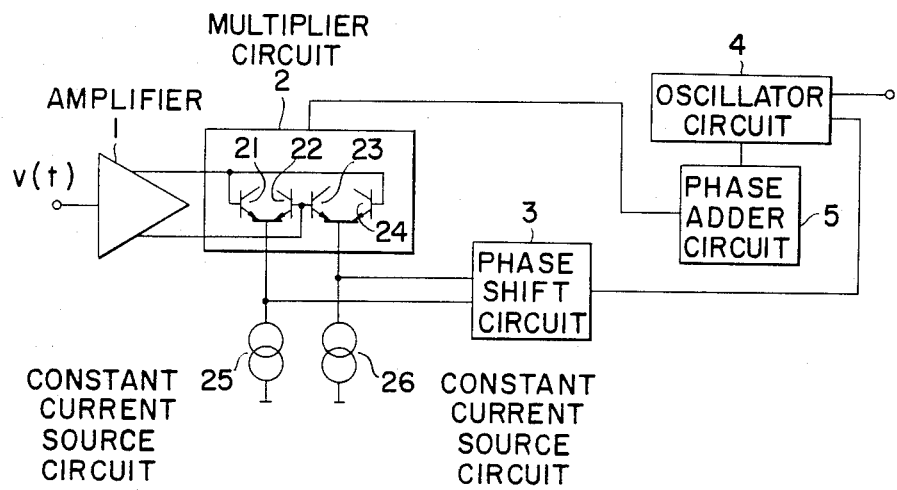
FIG. 1 is a block diagram illustrating one example of prior art frequency modulators.
Figure 2:
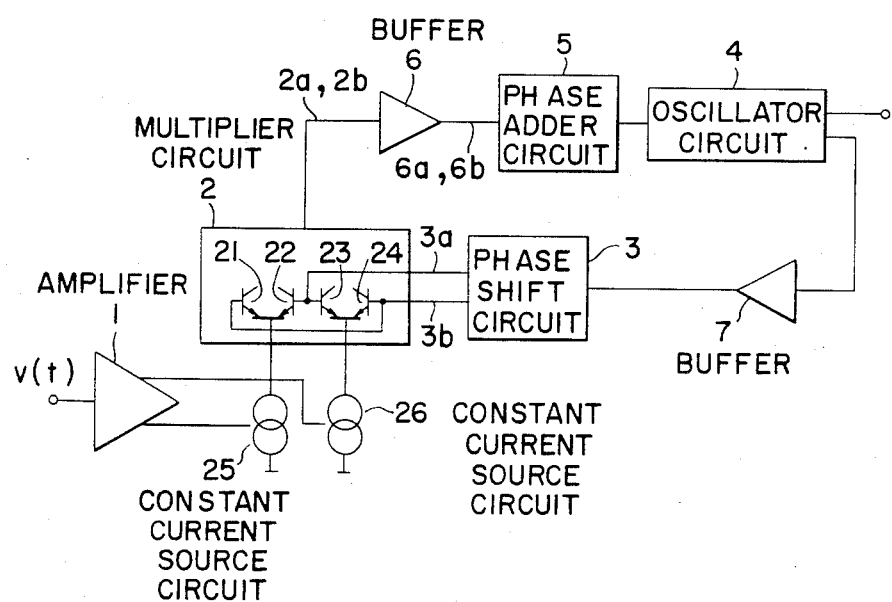
FIG. 2 is a block diagram illustrating one embodiment of the frequency modulator according to the present invention.
Figure 3:
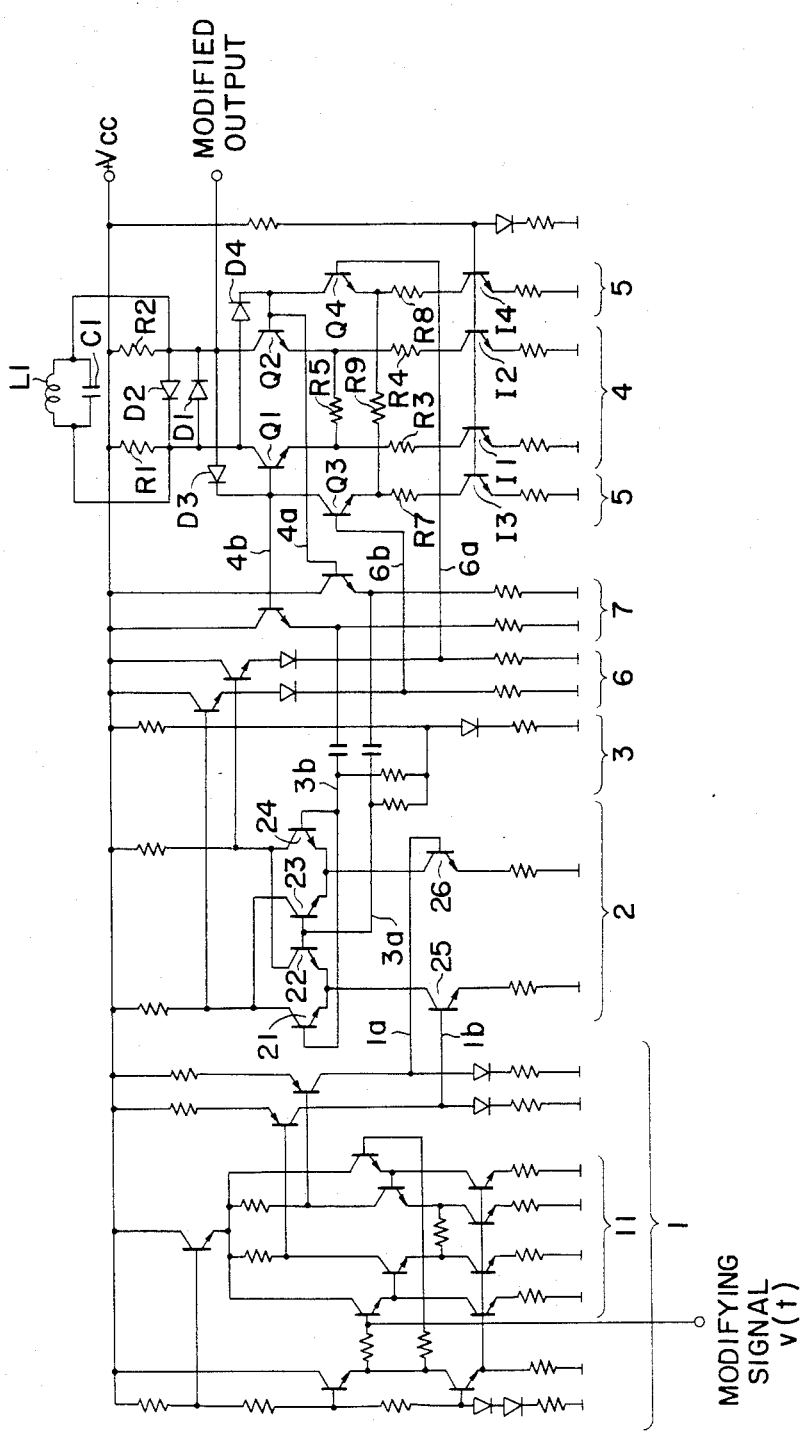
FIG. 3 is a circuit diagram showing details of the frequency modulator shown in FIG. 2.

FIG. 2 shows schematically one embodiment of the present invention, and FIG. 3 shows in detail the circuit arrangement of the embodiment shown in FIG. 2. In the figures, identical reference numbers are used to designate elements having the similar functions to those in FIG. 1.

An amplifier circuit 1 is mainly constructed of a differential amplifier circuit 11 which receives a modulating signal v(t). The outputs of the amplifier circuit 1 are used for controlling the constant current source circuits 25, 26 of a multiplier circuit 2, so that currents passing through the constant current source circuits 25, 26 may vary in accordance with the modulating signal v(t).

An oscillator circuit 4 is of a multivibrator type, oscillating at the frequency of 4.5 MHz and having transistors Q1, Q2, diodes D1 to D4, resistors R1 to R5, a capacitor C1, an inductor L1, and constant current source circuits I1, I2, all connnected as shown in FIG. 3. The outputs of the oscillator circuit 4 appearing at lines 4a, 4b are applied through a buffer 7 to a phase shift circuit 3. The outputs from the phase shift circuit 3 are input to the bases of transistors 21 to 24 which respectively serve as amplification elements of the multiplier circuit 2. The outputs of the phase shift circuit 3 are not applied to the emitters of the transistors 21 to 24 as in the prior art of FIG. 1, but are applied to the bases thereof. In addition, the outputs of the amplifier circuit 1 are not applied to the transistors 21 to 24 as in the prior art, but are used for controlling the constant current source circuits 25, 26.

The outputs of the multiplier circuit 2 appearing at lines 2a, 2b are supplied through a buffer 6 to a phase adder circuit 5. The phase adder circuit 5 is composed of transistors Q3, Q4, a series connection of a resistor R7 and a constant current source circuit I3, a series connection or a resistor R8 abd a constant current source circuit I4, and a resistor R9. The collectors of the transistors Q3, Q4 are respectively connected to the bases of the transistors Q1, Q2 of the oscillator circuit 4, and the emitters of the transistors Q3, Q4 are respectively connected to the series connections. The resistor R9 is connected between the emitters of the transistors Q3, Q4. Thus, the transistors Q3, Q4 serving as amplification elements of the phase adder circuit 5, and the transistors Q1, Q2 serving as amplification elements of the oscillator circuit 4 are connected in parallel with respect to a power source +Vcc, and the phase adder circuit 5 is operated in a voltage driven mode.

As described above, according to the invention, the outputs of the amplifier circuit 1 for amplifying the modulating signal are used for controlling the constant current source circuits 25, 26 of the multiplier circuit 2, so that the output level of the amplifier circuit 1 can be made higher, which leads to an easier design for the amplifier circuit. Moreover, since the outputs of the phase shift circuit 3 are applied to the bases of the transistors 21 to 24 of the multiplier circuit 2, the design for the phase shift circuit 3 is easier, eliminating dependency of the phase shift circuit 3 upon the characteristics of the multiplier circuit 2. Therefore, variations of the frequency modulation degree due to manufacturing tolerances can be maintained at a low level. Furthermore, the amplification elements of the phase adder circuit 5 and the oscillator circuit 4 are connected in parallel with respect to the power source, and the outputs of the multiplier circuit 2 are supplied to the phase adder circuit 5 through the buffer 6. As a result, the oscillator circuit 4 can be designed independently of other circuits, and a lower power source voltage will suffice for obtaining an expected circuit operation.

What is claimed is:

1. A frequency modulator comprising an oscillator circuit including an amplification element, a phase shift circuit for phase-shifting an oscillation output of said oscillator circuit by the amount of 90 degrees, a multiplier circuit including an amplification element and multiplying an output of said phase shift circuit by a modulating signal, and a phase adder circuit for varying an oscillation frequency of said oscillator circuit by adding the output of said multiplier circuit, wherein the amplification element of said phase adder circuit and the amplification of said oscillator circuit are connected in parallel with respect to a power source, and said multiplier circuit comprises an amplification element connected to receive the output of said phase shift circuit, and a constant current source circuit connected in series with said amplification element of said multiplier circuit and varying the magnitude of a current passing through said amplification element of said multiplier circuit in accordance with said modulating signal.

2. A frequency modulator as set forth in claim 1, in which said constant current source circuit of said multiplier circuit comprises a transistor connected to receive, at its base, said modulating signal.

3. A frequency modulator as set forth in claim 1, in which said amplification element of said multiplier circuit comprises a transistor connected to receive, at its base, the output of said phase shift circuit.

4. A frequency modulator as set forth in claim 1, in which said amplification element of said oscillator circuit comprises a transistor connected to receive, at its base, the output of said phase adder circuit.

5. A frequency modulator as set forth in claim 4, in which said amplification element of said phase adder circuit comprises a transistor, whose collector is connected to the base of said transistor of said oscillator circuit.

* * * * *